United States Patent [19]
Putt et al.

[11] Patent Number: 5,706,214
[45] Date of Patent: Jan. 6, 1998

[54] CALIBRATION OF MICROCOMPUTER-BASED METERING APPARATUS

[75] Inventors: Sally A. Putt, Imperial; Robert T. Elms, Monroeville, both of Pa.

[73] Assignee: Eaton Corporation, Cleveland, Ohio

[21] Appl. No.: 412,814

[22] Filed: Mar. 29, 1995

[51] Int. Cl.[6] .......................... G01R 21/06; H03M 1/10
[52] U.S. Cl. .................. 364/571.01; 364/483; 364/581; 364/582; 324/142
[58] Field of Search .................. 364/571.01, 571.03, 364/483, 581, 485, 582, 480, 481; 324/141, 142, 78, 83

[56] References Cited

U.S. PATENT DOCUMENTS

| | | | |
|---|---|---|---|
| 4,672,555 | 6/1987 | Hart et al. | 364/483 |
| 4,794,369 | 12/1988 | Haferd | 364/483 |
| 4,814,696 | 3/1989 | Kern et al. | 324/142 |
| 4,884,021 | 11/1989 | Hammond et al. | 324/142 |
| 4,892,282 | 1/1990 | Orwell | 364/571.01 |
| 4,933,869 | 6/1990 | Gareis et al. | 364/582 |
| 4,937,520 | 6/1990 | Arseneau et al. | 324/141 |
| 4,980,634 | 12/1990 | Mallinson | 324/142 |
| 5,122,735 | 6/1992 | Porter et al. | 324/142 |
| 5,173,657 | 12/1992 | Holdsclaw | 324/142 |
| 5,212,441 | 5/1993 | McEachern et al. | 324/142 |
| 5,247,467 | 9/1993 | Nguyen et al. | 364/571.02 |
| 5,270,898 | 12/1993 | Elms et al. | 361/96 |
| 5,298,856 | 3/1994 | McEachern et al. | 324/142 |
| 5,325,315 | 6/1994 | Elms et al. | 364/571.05 |
| 5,361,218 | 11/1994 | Tripp et al. | 364/571.03 |
| 5,477,471 | 12/1995 | Baum et al. | 364/582 |
| 5,515,295 | 5/1996 | Wang | 364/571.01 |

OTHER PUBLICATIONS

The Data Acquisition System handbook. vol. 29, 1995, Omega Engineering, Inc.

*Primary Examiner*—James P. Trammell
*Assistant Examiner*—Bryan Bui
*Attorney, Agent, or Firm*—Martin J. Moran

[57] ABSTRACT

For calibration of a microprocessor-based electrical metering device, the scaled values of current and voltage inputs are presented on a display along side of the associated scaling factors. Soft keys on the display are used to increment or decrement the scaling factors to adjust the scaled values of the associated current or voltage to the value indicated by a precision reference meter which measures test values of current and voltage provided by a stable source. For analog inputs, both a zero scaling factor (offset) and a full scale factor (slope) are presented on the display adjacent the scaled analog value and can be separately adjusted by the soft keys.

14 Claims, 8 Drawing Sheets

CALIBRATION OF MICROCOMPUTER-BASED METERING APPARATUS

BACKGROUND OF THE INVENTION

1. Field of the Invention

This invention relates to calibration of microcomputer-based metering apparatus, particularly such apparatus used for monitoring electrical parameters of an electric power distribution system. More specifically, it relates to microcomputer-based metering apparatus having a display device on which the respective scaling factors can be displayed in conjunction with the measurements being calibrated.

2. Background Information

State of the art metering devices, such as for use with electric power distribution systems, incorporate a microcomputer which offers the opportunity for considerable functionality and flexibility in performing metering functions. Such metering apparatus typically monitors RMS and peak values of currents and voltages, power, energy, power factor, watts, VARs, K-factor, and in some cases, harmonic distortion.

Typically, such metering apparatus has a display on which the various parameters are presented, and a user interface through which the user can interact with the apparatus to select operating modes and conditions and request desired information. The microcomputer generates digital representations of the various parameters from analog input signals. These analog input signals which represent current and voltage in the distribution system are scaled down by input circuits to the 0-20 ma and 0-10 volt input ranges of the analog to digital converters of the meter.

Currently, such apparatus is calibrated by a separate computer. A stable reference input to the meter to be calibrated and the output response of the meter are provided to the computer which calculates a scaling factor. The scaling factor is then downloaded to the microcomputer of the meter. This is done for each of the inputs to the meter. Thus, the present system for calibration requires a separate computer and also does not provide a clear indication to the user of the effect of the computer scaling factors.

There is a need for improved apparatus for calibrating microcomputer based meters, especially those for use with electrical power distribution systems.

There is a more particular need for an improved microcomputer based metering device which is easier to calibrate and provides a clear indication of the effects of adjusting the scaling factors.

There is also a need for such improved metering device which does not require a separate computer for calibration.

SUMMARY OF THE INVENTION

These needs and others are satisfied by the invention which is directed to a microcomputer based metering device in which scaling factors applied to sensed values of input electrical parameters to generate metered values, are displayed for calibration purposes on a display device together with metered values. The scaling factors can be adjusted through a user interface to adjust the displayed metered value to bring it into agreement with a reference value of the parameter which can be measured by a precision meter. Preferably, the adjustment of the scaling factors is limited such as to a range of values around a nominal value for the scaling factor. For instance, the scaling factors can be limited to about plus or minus 5 percent of the nominal value.

The invention is directed both to the microcomputer based metering device with the above-described features for calibration, as well as the method of calibrating such a device.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENT

The present invention is directed to devices which measure electrical parameters in electric power circuits. It will be described as applied to a metering device which is used to monitor these electrical parameters. However, it will be understood that the invention is equally applicable to other devices such as for instance circuit breakers which perform a metering function to determine the currents in a protected circuit. The invention could also be applied to other devices which perform a metering function in addition to other functions, such as for instance, a contactor a motor starter.

Figure 1:
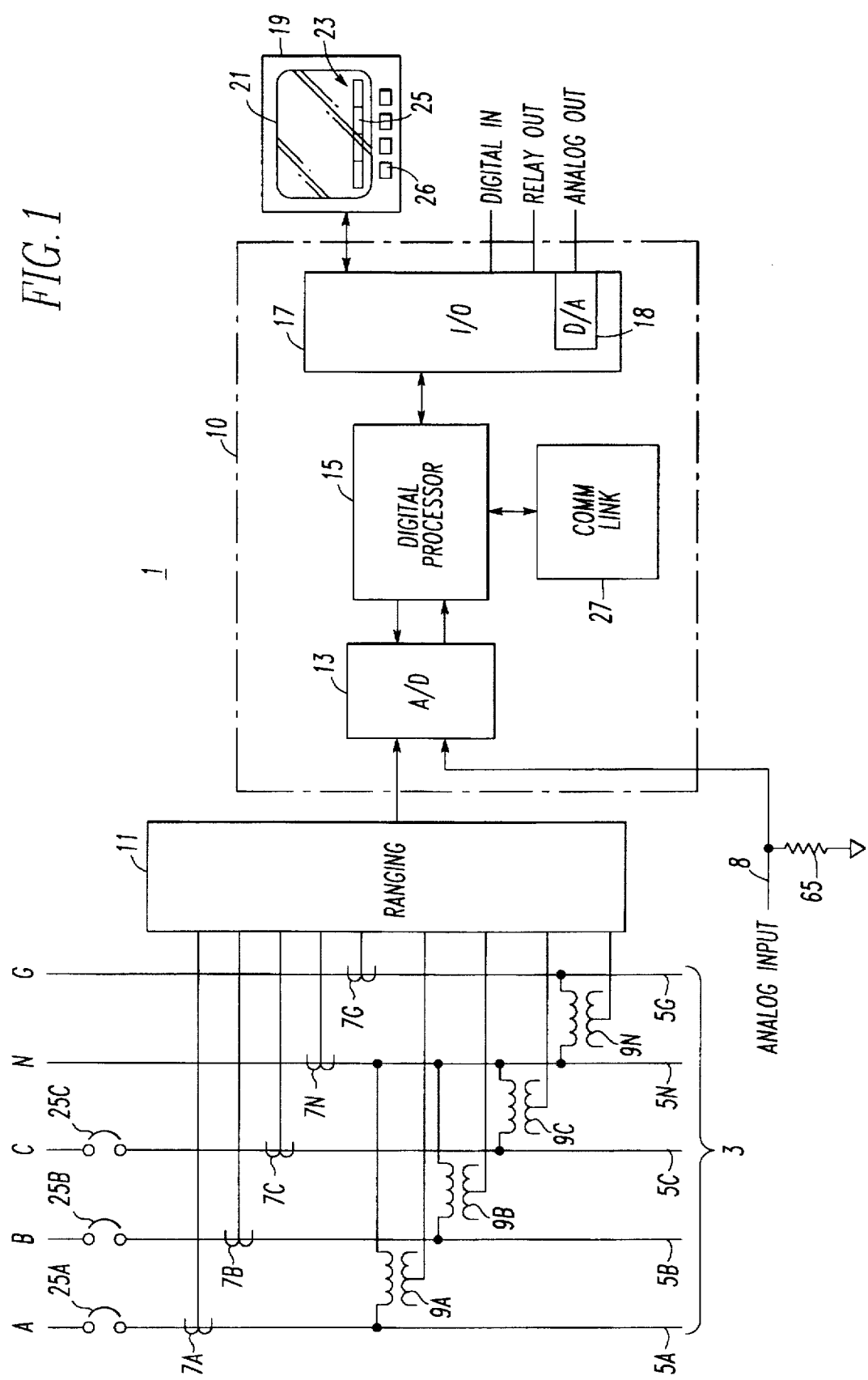
FIG. 1 is a schematic diagram, mainly in block diagram form, of a metering device in accordance with the invention.

Turning to FIG. 1 the monitor or metering device 1 of the invention is used to monitor and analyze an ac electric power system 3 such as a power distribution system. The power distribution system 3 illustrated has three phase conductors 5A, 5B and 5C, a neutral conductor 5N and a ground conductor 5G. Current transformers 7A, 7B, 7C, 7N and 7G sense current flowing in each or these conductors while phase-to-neutral voltages are sensed by the potential transformers 9A. 9B and 9C, and neutral to ground voltage is sensed by transformer 9N. A microcomputer 10 includes a ranging circuit 11 which converts the current and voltage signals from −10 to 0 to +10 volt signals for conversion by an analog to digital (A/D) converter 13 for input to a digital processor 15. The A/D converter 13 samples the analog voltages and currents at sampling rates determined by interrupts generated by the digital processor 15.

The digital processor 15 utilizes the data generated by the digital samples of current and voltage to generate values of two sets of electrical parameters. The first set of parameters is related to the monitoring functions and includes metered parameters such as, for example: RMS currents and voltages, peak currents and voltages, minimum currents and voltages, power factor, watts, VARs, volt-amps, total harmonic factor, K-factor, CBMEA derating factor, and the like. The second set of parameters calculated by the digital processor 15 comprises the individual harmonic coefficients representative of relative amplitude of each harmonic.

The microcomputer 10 has an input-output (I/O) 17 through which the processor 15 is connected to a front panel 19. The front panel 19 has a display device 21 such as gas plasma display and a user interface 23. Preferably, the user interface is in the form of soft keys 25 presented on the display 21. The user makes a selection by touching an appropriate one of a number of switches 26 on the front panel adjacent the display 21. The functions of the switches 26 are indicated by the soft switch icons 25 presented on the display and can change from screen to screen as will be seen. Other types of user interface devices 23 can be used such as a keyboard, mouse or track ball. Preferably, the microcomputer with its ranging circuits 11, processor 15 and I/O 17 is integrated on a single chip with a communications link 27 such as shown in U.S. Pat. No. 5,270,898 which is hereby incorporated by reference.

The input/output device 17 also interfaces the digital processor 15 with contact inputs through a DIGITAL IN input. A RELAY OUTPUT, and an ANALOG OUTPUT through a digital to analog (D/A) converter 18, are also provided through the input/output device 17. The digital processor 15 can also communicate with a remote processor (not shown) through a communications link 27. In addition to the voltage and current inputs from the electrical system 3, the microcomputer 10 can also accommodate analog inputs applied through the ranging circuit 11.

Figure 2:
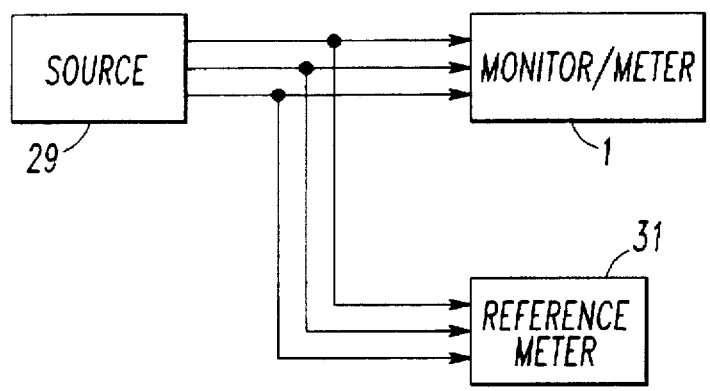
FIG. 2 is a schematic diagram in block form illustrating an arrangement for calibrating the metering device of FIG. 1 in accordance with the invention.
Figure 3A:
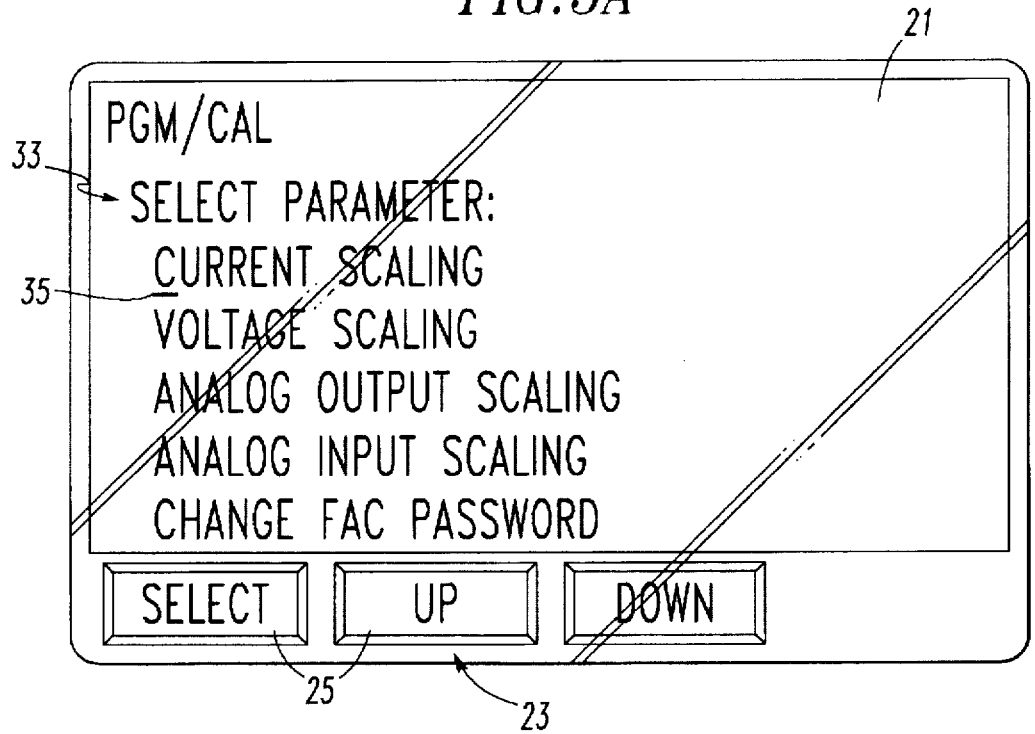
FIGS. 3A-3G are illustrations of display screens generated in accordance with the invention for calibration of the metering device of FIG. 1 using the arrangement of FIG. 2.
Figure 3B:
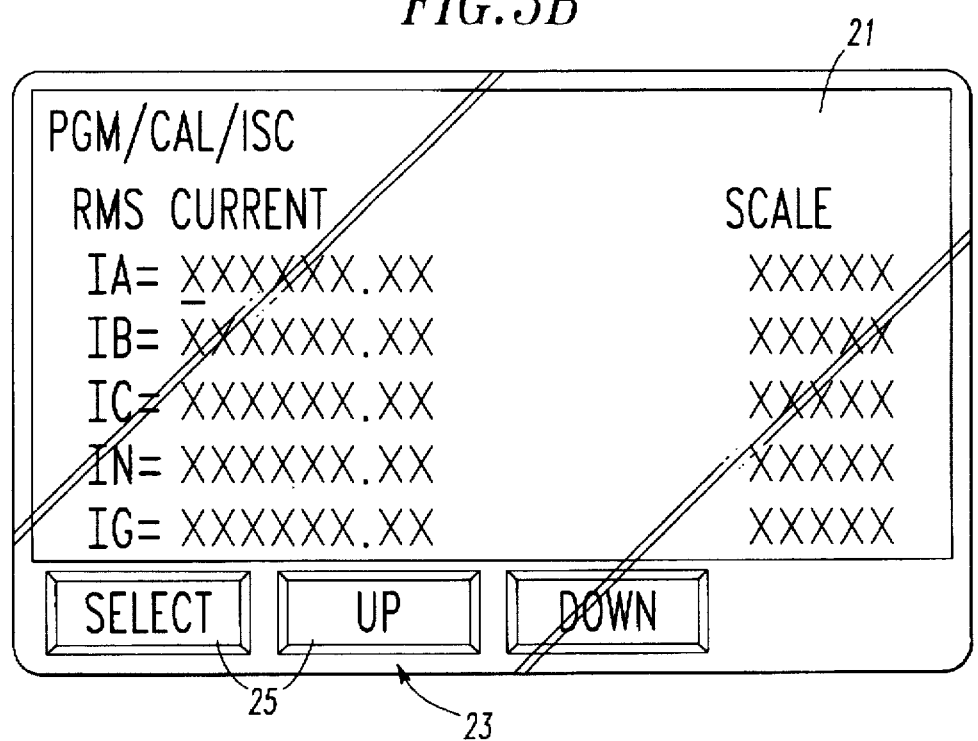

For calibrating the monitor/meter 1, a source 29 providing stable values of voltage and current is connected to the input ranging circuits of the device 1 as shown in FIG. 2. The stable values of current or voltage are also applied to a precision meter 31 which provides a reference value for the input parameters. Calibration is accessible from a top level program menu (not shown) if a correct factory password is entered. This presents to the user on the display device the calibration menu screen 33 illustrated in FIG. 3A. As can be seen, this calibration menu 33 provides several categories of parameters to calibrate. These include current, voltage, analog output, analog input, and changing the factory password. The soft switches 25 which include SEL, UP, and DOWN on this screen permit the user to select the parameter to be calibrated by positioning a curser 35 with the soft switches UP and DOWN, and entering the selection by using the SEL soft switch. When one of the parameters is selected, an associated screen is presented on the display 21. For instance, when current is selected the screen shown in FIG. 3B is generated. This screen lists all of the currents which includes the phase currents, IA, IB, IC, IN, and IG, the metered value of each of these currents and the associated scale factor used to calculate the current from the stable value of current supplied by the source. The particular current to be calibrated is again selected by the soft switches 25.

Figure 3C:
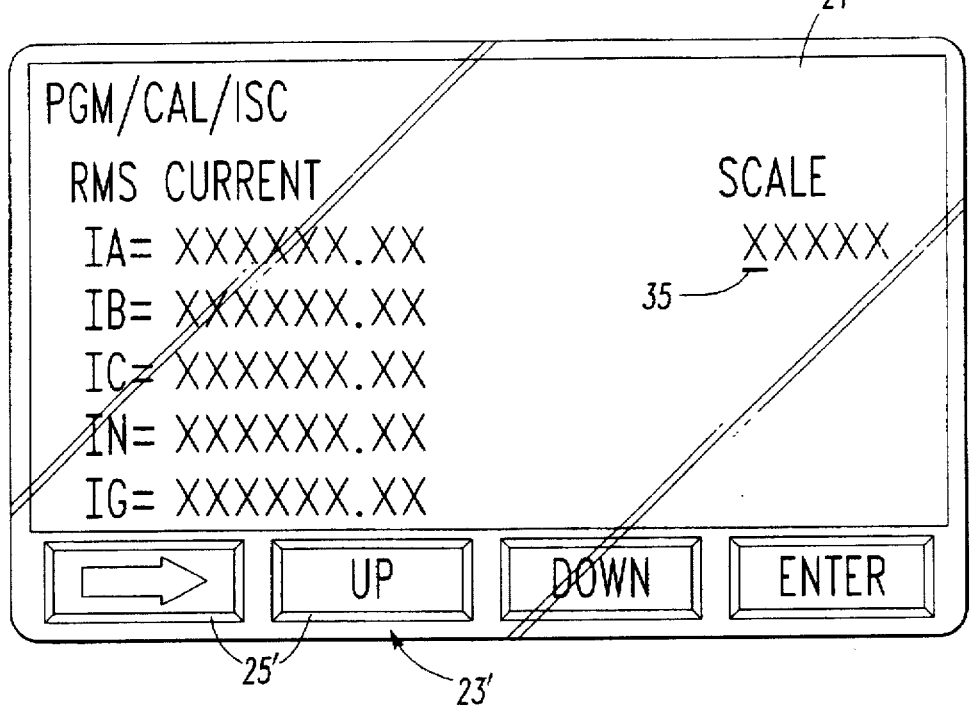

When one of the currents has been selected, a new screen, such as the screen shown in FIG. 3C for selection of phase current IA, is presented. As seen from FIG. 3C, the metered values for all of the currents are displayed but only the scale factor for the selected current, IA, is presented. The first digit only of the scale factor for the selected current blinks and new soft keys 25/ are presented. The far left soft key is a right arrow to allow the user to move the curser to the next digit on the right. The middle two soft keys are used to increment/decrement the digit value. The far right soft key is then used to enter the adjusted value of the scaling factor. The user locates the curser on a particular digit with the arrow soft key. Then the digit is incremented or decremented by the up/down soft keys. As the scale factors change, the effects are shown by the real-time metered value which is displayed next to the scale factor. The metered value shown for the current is the RMS value. In calibrating the current, the user adjusts the scale factor up or down to make the metered value shown next to the scale factor as close as possible to the referenced value generated by the precision meter 31.

Figure 3D:
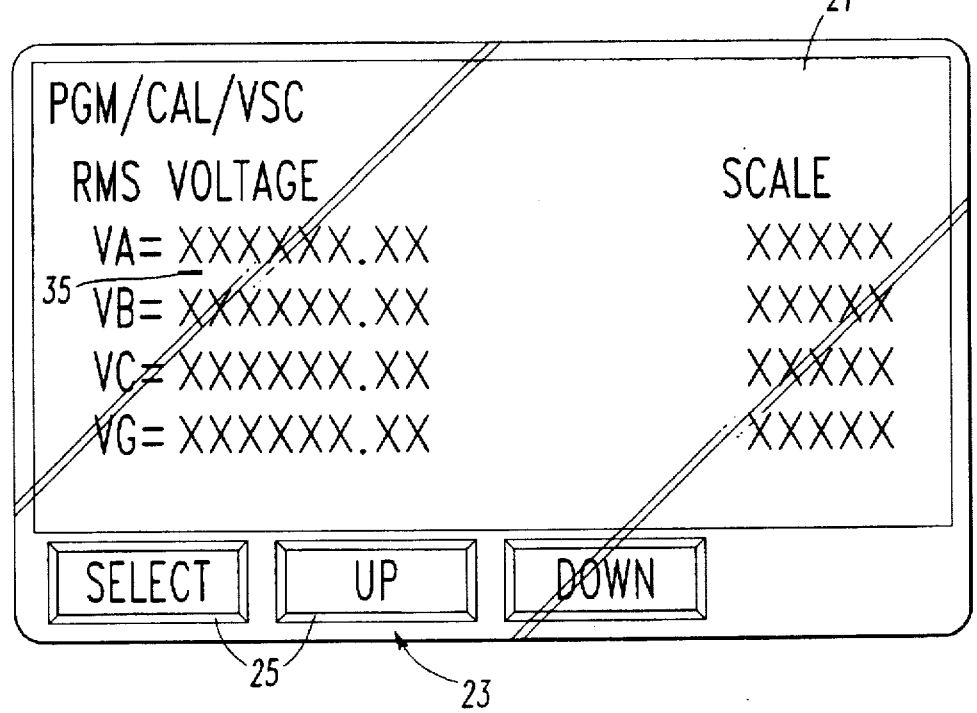

FIG. 3D illustrates the menu presented on the display 21 for selecting a voltage for calibration. As in the case of the currents, the RMS metered value is displayed along with the scaling factor used to generate that metered reading from the input value of the voltage. As in the case of the current menu, the soft keys 23' are used to highlight the particular voltage to be selected for calibration. The screen for voltage calibration (not shown) is similar to FIG. 3C shown for current calibration. That is, the metered values of all of the voltages are shown but only the scaling factor for the selected voltage is displayed.

Figure 3E:
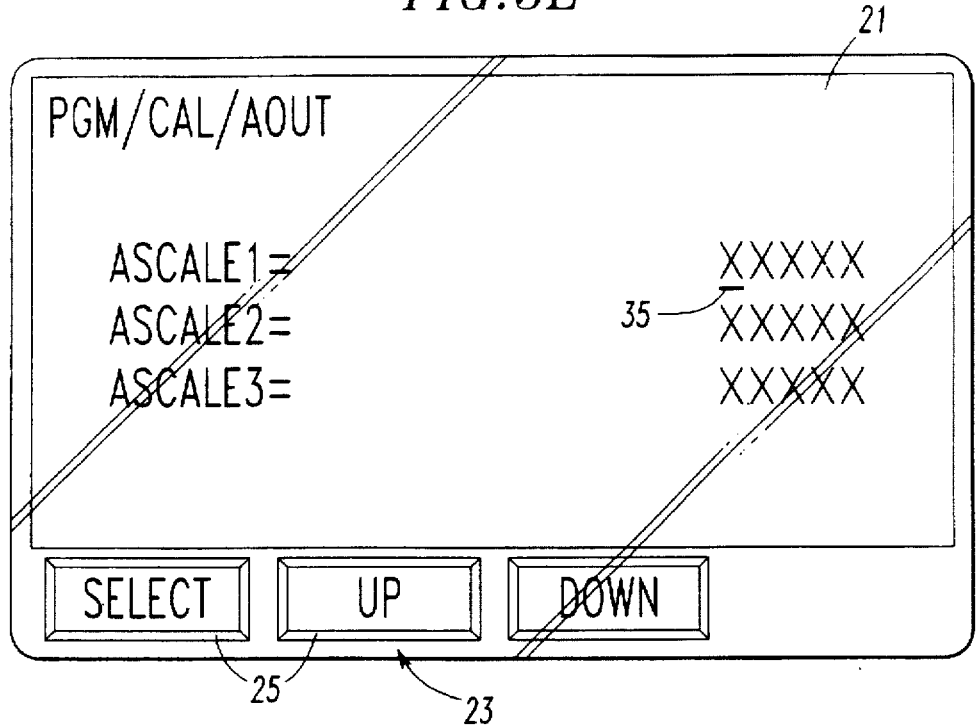

FIG. 3E illustrates the menu presented on display 21 for selecting an analog output signal for calibration. As the monitor/meter 1 does not measure the analog output value, only the scale factors are presented on the display 21. The scale factor value is changed on a screen (not shown) where only the selected scale factor is presented.

Figure 3F:
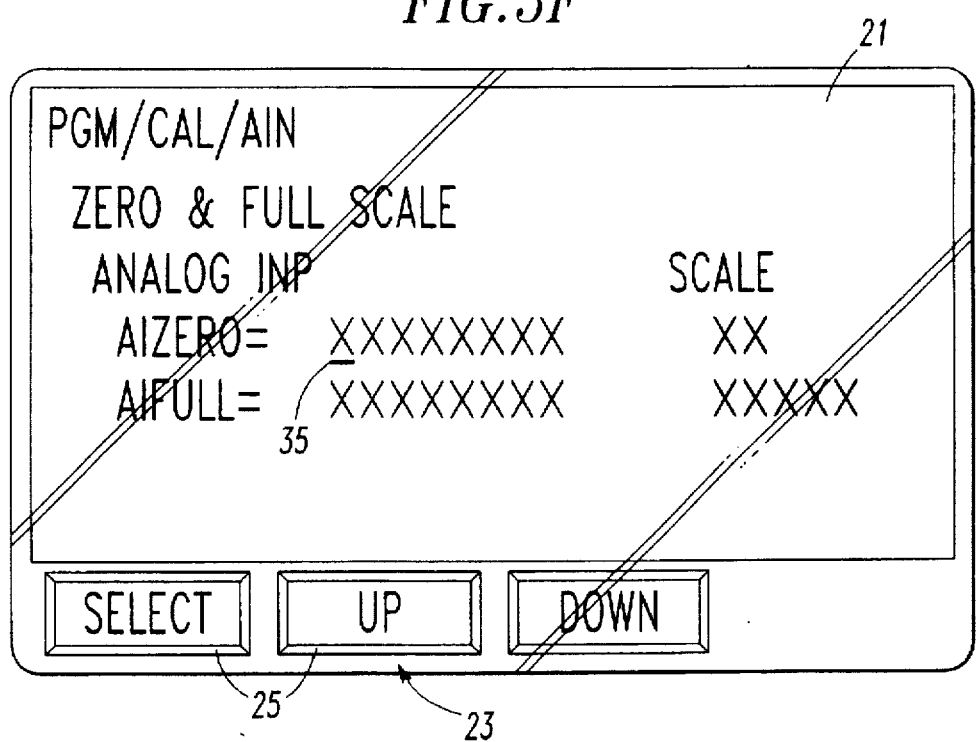

Two scale factors are applied to the analog input signals: a zero scale factor or offset, and a full scale factor or slope. When the analog input scaling is selected from the menu of FIG. 3A, the screen shown in FIG. 3F is presented on the display 21. This display shows the analog input zero scaling factor adjacent to the metered value and the analog input full scale scaling factor also adjacent the metered value. The metered value of the analog input is a function of the zero scaling factor and the full scale scaling factor so that the metered values adjacent the respective scaling factors in FIG. 3F brings up a new screen (not shown, but similar to the screen of FIG. 3C) from which the selected scaling factor can be adjusted.

Figure 3G:
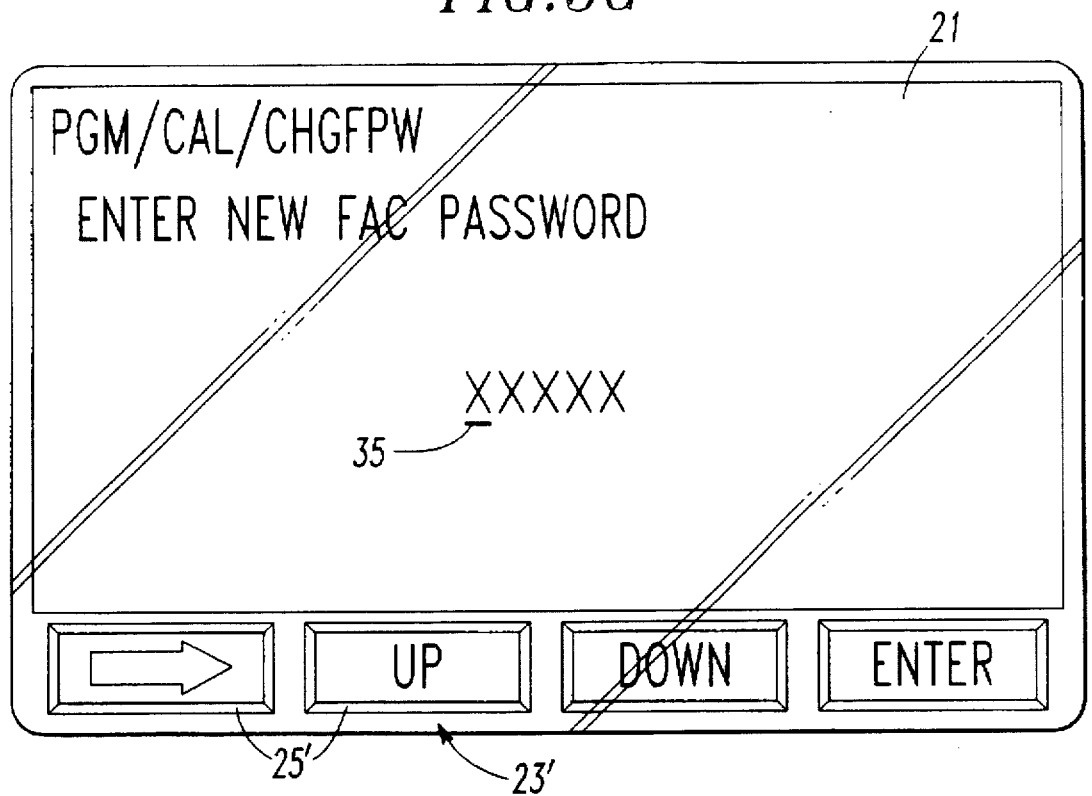

The operator may also change the factory inserted password using the screen shown in FIG. 3G. Successive digits are selected using the arrow soft key, and incremented with the UP and DOWN soft keys. The new password is then entered with the ENTER soft key.

Figure 4:
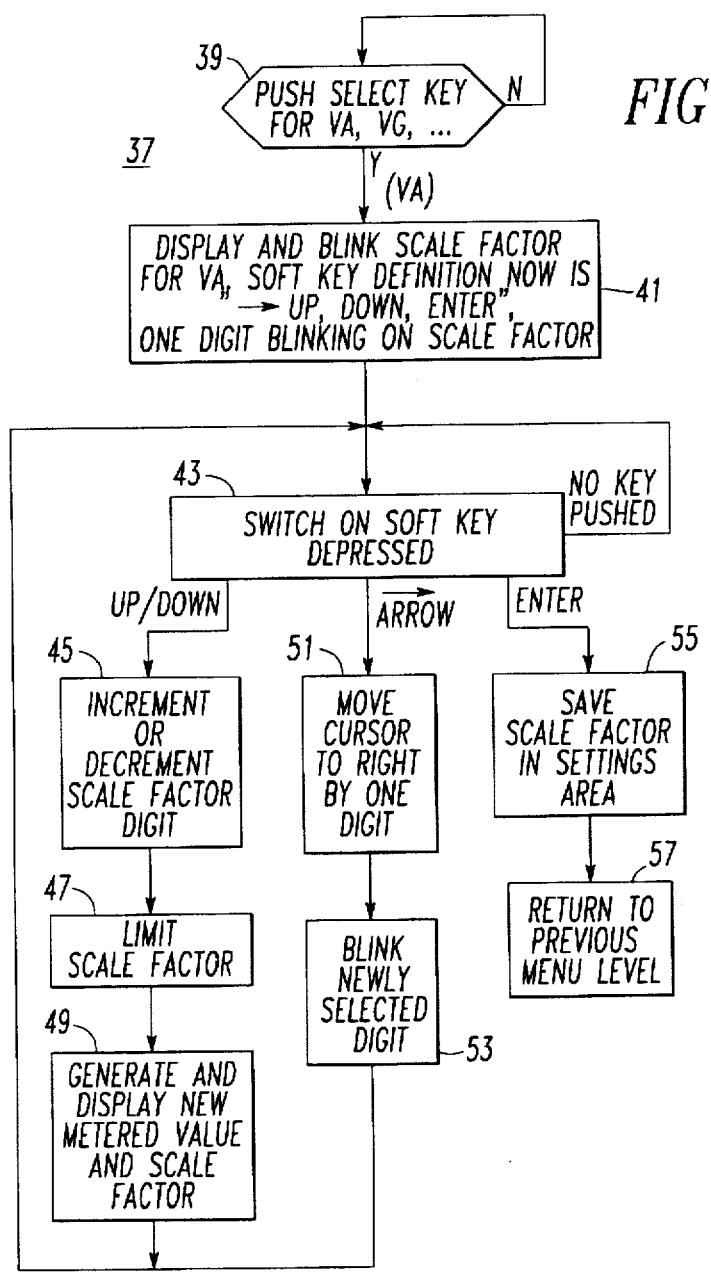
FIG. 4 is a flow chart of a routine used to change a scale factor in accordance with the invention.

FIG. 4 illustrates a flow chart of a routine used by the processor 15 for effecting a change in a scale factor for a selected parameter. When a soft key for a particular parameter is selected at 39, such as for example a current shown in Figure 3D, the selected scale factor is displayed and is flashed. The soft key definitions for changing the scale factors such as shown in FIG. 3C are then presented as shown at 41. If the soft key is depressed at 43 is an UP or DOWN soft key, the selected digit of the scale factor is appropriately incremented or decremented at 45. The processor limits the range over which the scale factor can be adjusted as indicated at 47. Preferably, this limitation on adjusting the scale factors is + or −5 percent of a nominal value for the scale factor. The adjusted scale factor is then used to generate a new metered value which is displayed along with the adjusted scale factor at 49. If the arrow soft key is depressed at 43 the curser moves to the right by one digit at 51 and a newly selected digit is blinked at 53. When the user is satisfied with the adjusted scale factor the ENTER soft key is pressed at 43. This saves the scale factor in a settings area of the microcomputer memory as indicated at 55 and then the program returns to the previous menu level at 57.

Figure 5:
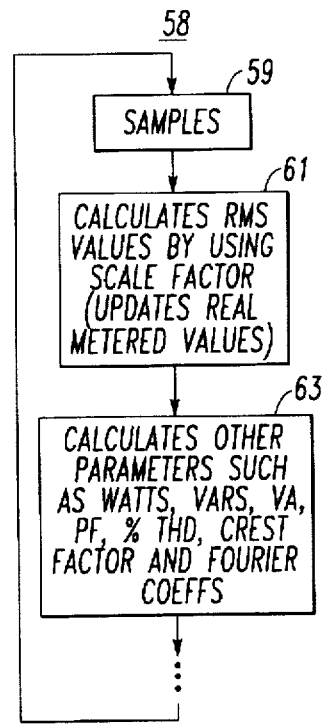
FIG. 5 is a flow chart of a main routine utilized by the microcomputer in the metering device of FIG. 1.

FIG. 5 illustrates a flow chart 58 for the major functions of the meter/monitor 1. This includes a sampling routine 59 which is initiated by a time interrupt to sample the input currents voltages and analog signals. The sample values are then used at 61 to calculate the RMS values using the stored scaling factors. The other parameters such as watts, vars, volt-amps, power factor, percent total harmonic distortion, crest factor, and coefficients for individual harmonic calculations are performed at 63 as time allows. Additional functions not pertinent to the present invention are also performed in the loop.

Figure 6:
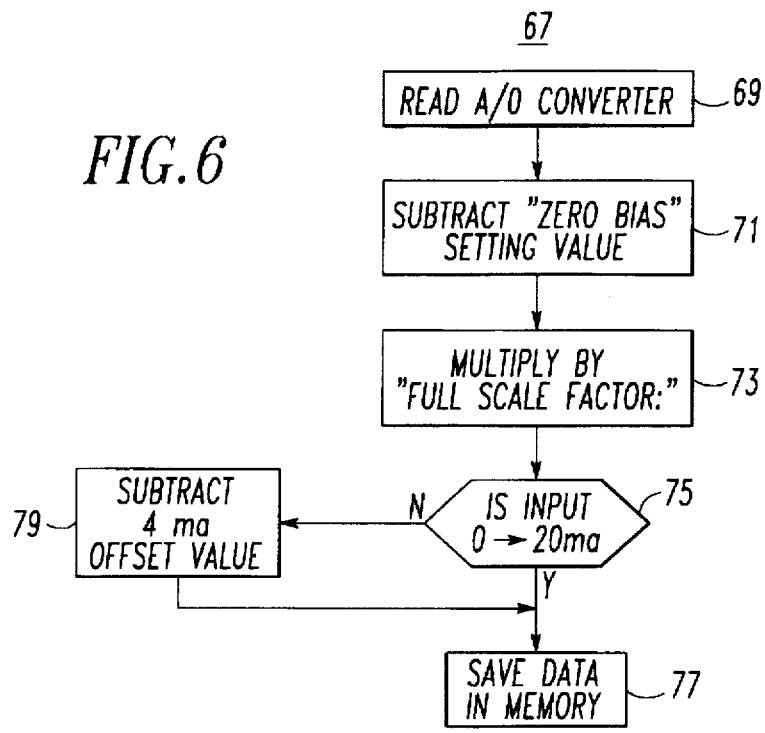
FIG. 6 is a flow chart of a routine used to scale analog inputs in accordance with the invention.

As mentioned above, the meter/monitor 1 can also accommodate analog inputs. The analog signals are applied to an input resistor 65. The voltage across the resistor is read the by A/D converter 13. FIG. 6 illustrates a flow chart 67 used by the digital processor 15 to appropriately scale the digital signal corresponding to the analog input. Two scaling factors are applied to these signals: a zero scale factor which applies a dc offset, and a full-scale factor which in effect adjusts the slope of the conversion function. The digital processor 15 reads the digital value of the analog signal generated by the A/D converter at 69. The zero scale factor is then subtracted at 71 with the result then multiplied by the full-scale factor at 73. The analog input signals can be either 0 to 20 ma or 4–20 ma signals. This information is provided to the digital processor 15 separate. If the input signal is a 0–20 ma signal, as determined at 75, the data is stored at 77. If however, the input signal is a 4–20 ma signal, 4 ma is subtracted at 79 before the data is stored at 77. As discussed above, in connection with FIG. 3F, the analog inputs are calibrated by adjusting both the zero scaling factor and the full-scale scaling factor using the soft keys on the display.

Figure 7:
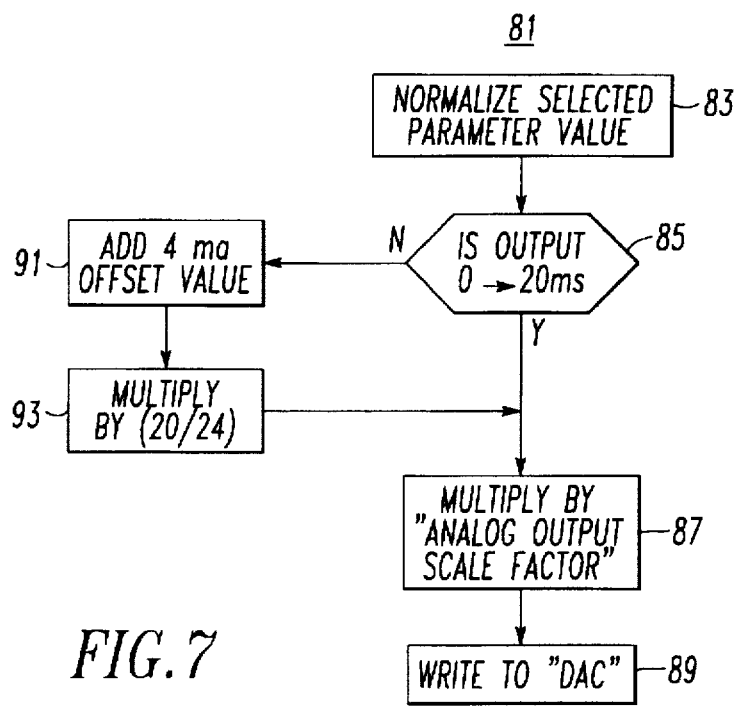
FIG. 7 is a flow chart of a routine for scaling analog outputs in accordance with the invention.

The meter/monitor 1 utilizes the arrangement shown in FIG. 7 for generating analog outputs. It should be understood that these analog outputs can represent various measured or calculated parameters monitored by the meter/monitor 1. For instance, they could be voltages, currents, watts, etc. These analog output signals can also be 0–20 ma signals or 4–20 ma signals. Accordingly, the digital processor 15 utilizes the routine 81 of FIG. 7 to appropriately scale the analog outputs. First, the routine 81 normalizes the parameter value to be output as an analog signal at 83. That is, it converts it to a 0 to a 100% signal. If the output signal is a 0–20 ma signal as determined at 85, the normalized parameter value is multiplied by the analog output scale factor at 87 and written to the digital to analog converter at 89. On the other hand, if the output signal is to be a 4–20 ma signal, the 4 ma offset is added to the normalized value at 91 and the sum is multiplied by 20/24 at 93. The resultant converted signal is then multiplied by the analog output scale factor at 87 before being output to the digital to analog converter at 89.

Figure 8:
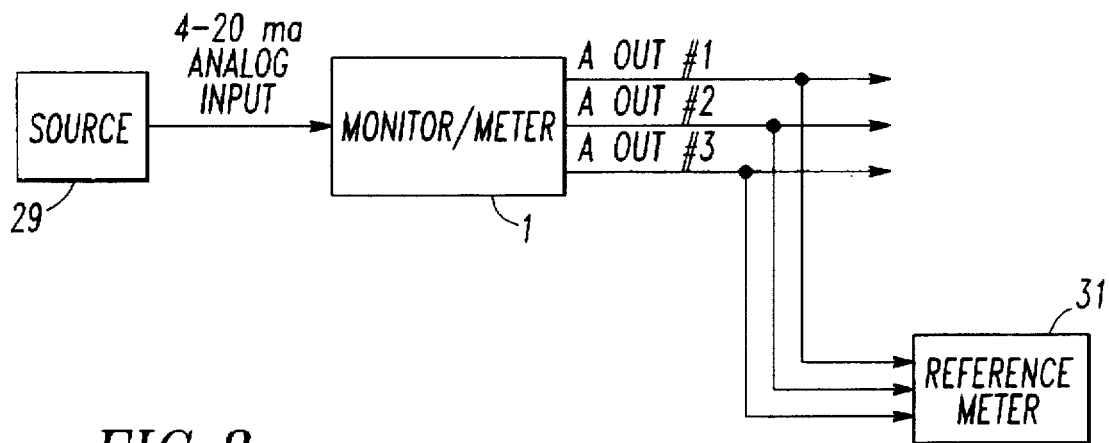
FIG. 8 is a schematic diagram in block form of an arrangement for calibrating analog output scaling in accordance with the invention.

The meter/monitor 1 does not measure the analog output signals. Therefore, in order to calibrate the analog outputs, the arrangement shown in FIG. 8 is utilized. Appropriate inputs for generating the desired analog output signal are provided by the stable source 29. For instance, if the analog output is to be an RMS current, the appropriate stable current value is provided to the meter/monitor I by the source 29. Typically, the test signal is 90% of the full-scale value, although this is not a necessity. The precision reference meter 31 is connected to the appropriate analog output (s). The calibration is then performed as described above in connection with FIG. 3E. As explained there, only the single scale factor for each analog output is presented on the display 21. This scale factor is adjusted with the soft keys to adjust the meter reading to the digital value of the parameter being output. For instance, the scaled value of the RMS input current determined by the digital processor is read from the meter using the display of FIG. 3D. Then, using the display of FIG. 3E, the scale factor for the analog output can be adjusted until the meter 31 reads the same value as the digital value indicated by the microprocessor.

While specific embodiments of the invention have been described in detail, it will be appreciated by those skilled in the art that various modifications and alternatives to those details could be developed in light of the overall teachings or the disclosure. Accordingly, the particular arrangements disclosed are meant to be illustrative only and not limiting as to the scope of invention which is to be given the full breadth of the claims appended and any and all equivalents thereof.

What is claimed is:

1. A microcomputer-based electric metering device for monitoring electrical parameters in an electric power distribution system, said device comprising:

input means sensing said electrical parameters to generate sensed parameter values;

processor means for applying an associated adjustable scaling factor to each sensed parameter value;

display means displaying said metered parameter values and said associated adjustable scaling factors; and user interface means for selecting a selected scaled parameter value and for adjusting the associated adjustable scaling factor to generate an adjusted scaling factor, said processor means including means applying said adjusted scaling factor to said sensed parameter value to generate an adjusted scaled parameter value, and displaying on said display means said adjusted scaled parameter value in association with the associated adjusted scaling factor.

2. The metering device of claim 1 wherein said processor means includes means limiting adjustment of said adjustable scaling factors.

3. The metering device of claim 2 wherein said means limiting adjustment of said adjustable scaling factors comprises means limiting said adjustment to specified ranges around nominal values for said adjustable scaling factors.

4. The metering device of claim 1 wherein said input means includes means for inputting an analog signal, said processor means including means for applying a zero scaling factor and a full scale scaling factor to said analog signal to generate a scaled analog signal, said display means including displaying said scaled analog signal in association with said zero scaling factor and full scale scaling factor, and said user interface means including means for adjusting said zero scaling factor and said full scale scaling factor while displayed on said display means.

5. The metering device of claim 4 wherein said processor means includes means limiting adjustment of said zero scaling factor and said full scale scaling factor.

6. The metering device of claim 3 wherein said specified range is about plus and minus 5 percent of said nominal value.

7. The metering device of claim 4 including analog output signal generating means for generating an analog output signal from digital values generated by said processor means, and wherein said processor means includes means for applying an output scaling factor to said digital signals for generating a scaled analog output signal, wherein said display means includes means displaying said scaled analog output signal and said analog output scaling factor simultaneously, and wherein said user interface means includes means for adjusting said analog output scaling factor while displayed on said display means.

8. The metering device of claim 7 wherein said processor means includes means limiting adjustment of said analog output scaling factor.

9. In combination:

a microcomputer based electric metering device for monitoring electrical parameters in an electric power distribution system, said device comprising:

input means for sensing said electrical parameters to generate sensed parameter values;

processor means for applying an associated adjustable scaling factor to each sensed parameter value to generate scaled parameter values;

display means displaying said scaled parameter values and said associated adjustable scaling factors; and user interface means for selecting a selected electrical parameter value and for adjusting the associated adjustable scaling factor to generate an adjusted scaling factor, said processor means including means applying said adjusted scaling factor to said sensed parameter value generated from said selected electrical parameter to generate an adjusted scaled parameter value and displaying on said display means said adjusted scaled parameter value in association with the associated adjusted scaling factor; and a source of stable values of said selected electrical parameter connected to said input means; and a reference meter to which said stable values of said selected electrical parameter are also applied for generating reference parameter values of said selected electrical parameter, said adjustable scaling being adjusted through said user interface means for making said adjusted scaled parameter values substantially equal to said reference parameter values.

10. The combination of claim 9 wherein said processor means includes means limiting adjustment of said adjustable scaling factors.

11. The combination of claim 10 wherein said means limiting adjustment of said adjustable scaling factors comprises means limiting said adjustment to specified ranges around nominal values for said adjustable scaling factors.

12. A method of calibrating a microcomputer based metering device which applies an adjustable scaling factor to an input electrical parameter to generate a metered parameter value of the input electrical parameter and having a display means for displaying the metered parameter value, said method comprising the steps of:

connecting an electrical source generating a stable value of said input electrical parameter to said metering device;

displaying said adjustable scaling factor on said display means in association with said metered parameter value;

measuring said input electrical parameter with a precision meter to generate a reference parameter value for said input electrical parameter; and adjusting said adjustable scaling factor by reference to said display means until said metered parameter values substantially equals said reference parameter value.

13. The method of claim 12 including limiting said adjusting of said adjusting scalable factor to a specified range of scaling factors around a nominal value.

14. The method of claim 13 wherein said adjusting step comprises adjusting the scaling factor to limit values of said scaling factor to a range of about 5 percent of said nominal value.

* * * * *